United States Patent Office

3,794,494
Patented Feb. 26, 1974

3,794,494

PHOTOSENSITIVE COMPOSITIONS FOR RELIEF STRUCTURES

Tsunetoshi Kai, Saitama, Mitsuhiro Inoue and Matuo Yoshida, Asaka, and Jun-Ichi Ueda, Wakoh, Japan, assignors to Asahi Kasei Kogyo Kabushiki Kaisha, Osaka, Japan

No Drawing. Filed Nov. 24, 1971, Ser. No. 201,992
Claims priority, application Japan, Mar. 11, 1971, 46/13,009
Int. Cl. G03c *1/70*
U.S. Cl. 96—35.1 7 Claims

ABSTRACT OF THE DISCLOSURE

A photosensitive composition comprising (A) about 100 parts by weight of an unsaturated polyester produced from an alcoholic component comprising at least one polyol and an acidic component comprising at least one unsaturated dicarboxylic acid, its anhydride or its methyl or ethyl ester and having an average molecular weight of about 400 to 30,000 and ethylenic double bond equivalent of about 160 to 3,200, (B) about 1 to 50 parts by weight of an ethylenically unsaturated compound (i) of the formula

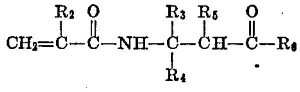

wherein $R_2$ represents a hydrogen atom or methyl group; and
$R_3$, $R_4$, $R_5$ and $R_6$ represent a hydrogen atom, an alkyl group or cycloalkyl group having at most 10 carbon atoms, and about 10 to 100 parts by weight of a compound (ii) of the formula

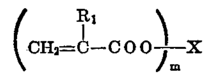

wherein $R_1$ represents a hydrogen atom or methyl group;
$m$ is an integer from 2 to 4; and
X represents a radical of a polyol having a molecular weight of at most 1,000 and $m$ terminal hydroxy groups from which the terminal hydroxy groups are excluded, and, (C) about 0.0001 to 10 parts by weight of a photopolymerization initiator.

The compositions are exposed to a light source through an image-bearing transparency to effect polymerization, and unpolymerized unexposed monomer is washed away, leaving a relief structure suitable for printing plates. The plates are characterized by good flexibility, hardness and water resistance.

---

This invention relates to novel photosensitive compositions. It more particularly refers to unsaturated polyester type photosensitive compositions which are photopolymerizable by the action of actinic light which are useful compositions for preparing relief image, especially relief printing plates.

Unsaturated polyester type photosensitive compositions are already disclosed in, for example, U.S. Pat. No. 2,760,863, and Japanese Pat. Nos. 542,045 and 599,101. Image making articles such as relief plates may be produced by forming a layer of the photosensive compositions of a desired thickness on a suitable base, exposing the layer to actinic light through, for example, a photographic negative film to photopolymerize the image areas and washing out the non-exposed areas. Relief plates thus obtained may be used as relief printing plates, dry offset printing plates, displays and name plates.

When printing plates for a newspaper rotary press are produced using photosensitive compositions, first, the time of producing printing plates is required to be sufficiently short. For this purpose especially the time of exposure must be short and the rate of washing out of unexposed portions must be high. Second, it is necessary to reproduce sharp image portions. For this effect the boundary between exposed portions and unexposed portions must be clear and the unexposed portions must be easily and readily washed out. Third, printing plates must have mechanical and chemical properties to resist a large number of impressions. Such properties include high tensile strength, hardness, resistance to solvents contained in printing ink and washing solutions and resistance to humidity in air. Fourth, the production of printing plates must be safely effected. Especially the use of organic solvents for washing out unexposed portions should be avoided because of inflammability, toxicity and offensive odor, use of water and aqueous solutions such as dilute sodium hydroxide solutions being preferred. Also the photosensitive compositions should not have an offensive odor.

Among these necessities, the second is especially important for relief-forming photosensitive compositions. For this purpose, first, the photosensitive compositions are required to be polymerized substantially only by actinic light. Namely, the photosensitive compositions which are thermally excited and polymerized are not suitable because both image portions and non-image portions are polymerized. Second, there must be a distinct difference of solubility in solvents on the boundary between exposed portions and unexposed portions. These are the substantial differences between a thermosetting resin and a photopolymerizable resin and a relief-forming photosensitive composition is not obtained merely by adding a photopolymerization initiator to a thermosetting resin.

Photosensitive compositions are known comprising an unsaturated polyester, an addition polymerizable ethylenically unsaturated monomer and a photopolymerization initiator activatable by actinic light. These unsaturated polyester type photosensitive compositions can be produced at relatively low cost and can be advantageously used in making printing plates for newspaper and other relief printing plates on an industrial scale. However, known unsaturated polyester type photosensitive compositions do not necessarily fulfill all the above-described desiderata.

As addition polymerizable ethylenically unsaturated monomers used in photosensitive compositions styrene and diallyphthalate have been employed, but these photopolymerize slowly and exhibit poor dispersibility and solubility in the water or aqueous sodium hydroxide solution such as is used to remove unpolymerized monomer. Thus, these monomers are not suitable for forming sharp reliefs in a short period. Furthermore, such monomers have a strong offensive odor even in small amount, for example, when present to the extent of 5 percent by weight, and thus pollute the general, and especially the immediate, environment.

It is known to use acrylic acid as the monomer in an unsaturated polyester-based photosensitive composition for relief-forming purpose. Acrylic acid is well photopolymerized with an unsaturated polyester and gives excellent mechanical properties to the resulting photopolymerized articles, but it exhibits high hygroscopicity and water absorption both as monomer or polymer. Namely, the photosensitive composition containing a large amount of acrylic acid absorbs moisture during storage which results in a decrease in photopolymerization rate and in tensile strength after photopolymerization. Also during washing out unexposed portions with an aqueous solution such as an aqueous sodium hydroxide solution in the production of printing plates, fine lines and dots sometimes absorb water, become brittle and break off.

Furthermore, the photopolymerized articles gradually absorb moisture and their tensile strength and hardness diminish when left standing in air. These unfavorable phenomena are especially apparent where the acrylic acid is present to the extent of 30 or more parts by weight per 100 parts by weight of unsaturated polyester.

It is accordingly an object of this invention to provide a novel photosensitive composition which gives a photopolymerized product having good flexibility and water resistance as well as high hardness and which is especially useful in the production of relief images, particularly relief printing plates.

Another object of this invention is to provide a novel photosensitive composition which substantially avoids the difficulties of prior art unsaturated polyester type photosensitive compositions.

Other and additional objects of this invention will become apparent from a consideration of this entire specification and claims.

In accord with and fulfilling these objects, there is provided a photosensitive composition comprising (A) about 100 parts by weight of an unsaturated polyester produced from an alcoholic component comprising at least one polyol and an acidic component comprising at least one unsaturated dicarboxylic acid, its anhydride or its methyl or ethyl ester and having an average molecular weight of about 4000 to 30,000 and ethylenic double bond equivalent of about 160 to 3,200, (B) about 1 to 50 parts by weight of an ethylenically unsaturated compound (i) of the formula

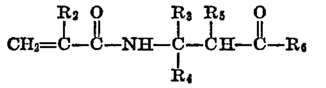

wherein $R_2$ represents a hydrogen atom or methyl group,
$R_3$, $R_4$, $R_5$ and $R_6$ represent a hydrogen atom, an alkyl group or cycloalkyl group having at most 10 carbon atoms, and about 10 to 100 parts by weight of a compound (ii) of the formula

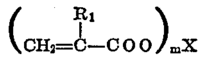

wherein $R_1$ represents a hydrogen atom or methyl group,
*m* is an integer from 2 to 4, and
X represents a radical of a polyol having a molecular weight of at most 1,000 and *m* terminal hydroxyl groups from which the terminal hydroxyl groups are excluded, and (C) about 0.0001 to 10 parts by weight of a photopolymerization initiator.

When the N-3-oxohydrocarbon-substitued acrylamide (i) is used alone special measures such as intense stirring are required because it is of limited compatibility with the unsaturated polyester; in the absence of such measures it is difficult to obtain a sufficient rate of photopolymerization and the desired mechanical properties after photopolymerization.

When the compound (ii) is used alone as the monomer, the rate of photopolymerization is lower than that of a photosensitive composition containing acrylic acid and the reliefs obtained by photopolymerization have so low an elongation that they shear off under the action of a horizontal force. It has now been found that by using the N-3-oxohydrocarbon-substituted acrylamide (i) in conjunction with (ii) the compositions exhibit an improved rate of photopolymerization and the reliefs have an increased tensile strength without reduction in surface hardness.

It is known that acrylamides are used as the monomers in an unsaturated polyester type photosensitive composition. However, the N-3-oxohydrocarbon-substituted acrylamide (i) according to the present invention has an effect completely different from the known acrylamides. The known acrylamides are useful for increasing surface hardness but simultaneously increase the Young's modulus. When these known acrylamides are used together with the compound (i) in the absence of acrylic acid, the photopolymerized article becomes more and more brittle. The known acrylamides are water-soluble either as monomer or polymer and there occurs the same problem as with acrylic acid. Contrary to the known acrylamides, the N-3-oxohydrocarbon-substituted acrylamides (i) give a suitable flexibility after photopolymerization while maintaining the same reactivity as the known acrylamides and it is noted that the N-3-oxohydrocarbon-substituted acrylamide monomers (i) are readily soluble and dispersible in water but are insoluble in water when polymerized. Consequently the boundary between exposed portions and unexposed portions can be clearly separated and sharp reliefs can be obtained.

The unsaturated polyesters of the present invention serve as a backbone in the photopolymerization of the photosensitive compositions and the ethylenic double bond contained in the straight chain can be addition-polymerized by actinic light with the monomers. As employed herein the term unsaturated polyester has reference to a linear polymer prepared by polycondensation of an alcoholic component comprising at least one polyol and an acidic component comprising at least one unsaturated dicarboxylic acid. When saturated polyesters not containing any ethylenic double bond are used, only the monomers photopolymerize and the rate of photopolymerization and the mechanical properties after photopolymerization decrease markedly compared to use of unsaturated polyesters.

The average molecular weight of the unsaturated polyesters is preferably in the range of from about 400 to 30,000. When the average molecular weight is below about 400, the tensile strength after photopolymerization tends to diminish. On the other hand the preparation of unsaturated polyesters having an average molecular weight above about 30,000 becomes difficult. When the average molecular weight is raised above about 30,000 partial gelation occurs during the preparation of unsaturated polyesters.

The unsaturated polyesters according to this invention can be characterized by the formula weight per single ethylenic double bond, hereinafter referred to as ethylenic double bond equivalent. This ethylenic double bond equivalent is calculated by the following formula:

Ethylenic double bond equivalent $$= \frac{\begin{matrix}\text{Mole} & & \text{Formula} & & \text{Formula}\\ \text{of} & \times & \text{weight of} & + & \text{weight of}\\ \text{OC—R—CO} & & \text{OC—R—CO} & & \text{O—R'—O}\end{matrix}}{\text{Mole of unsaturated dicarboxylic acid}}$$

wherein the polycondensation involves a dicarboxylic acid of the formula HOOC—R—COOH, and a diol of the formula HO—R'—OH; the formula weight of the segment corresponding to the dicarboxylic acid is calculated as OC—R—CO and that of the segment corresponding to the diol is calculated as O—R'—O.

It is preferred to use unsaturated polyesters having an ethylenic double bond equivalent of from about 160 to 3,200. When the ethylenic double bond equivalent is below about 160, it is difficult to obtain a sufficient tensile strength after the photopolymerization and the resulting reliefs are often hard but brittle. For example, the ethylenic double bond equivalent of polyethylene malate is 142 and that of polypropylene maleate is 156 and these are included in the above cases. On the other hand when the ethylenic double bond equivalent is above 3,200. the rate of photopolymerization is often reduced and the solvent resistance after photopolymerization is frequently decreased.

The unsaturated polyesters may be modified by having their chain lengths extended through reaction with a diisocyanate. When utilized, the diisocyanate is employed in about 0.5–1:1 molar ratio relative to starting polyester. The terminals of the starting unsaturated polyester are generally hydroxy groups, being prepared from an alcoholic component and an acidic component in a mole ratio about 1–2:1. The isocyanate group reacts with the terminal hydroxy group to form a urethane bond or even with a carboxyl group to form an amide bond. Thus obtained urethane-containing unsaturated polyesters are macroblock copolymers having a high molecular weight and the characteristics of unsaturated polyesters and have a much improved abrasion resistance and solvent resistance.

The diisocyanates to form the chain-extended unsaturated polyesters include 2,4-tolylene diisocyanate, phenylene diisocyanate, 3,3′ - bitolylenemethane - 4,4′-diisocyanate, metaphenylene diisocyanate, 4,4′-biphenylene diisocyanate, 4,4′-biphenylenemethane diisocyanate, xylene diisocyanates, 1,4 - naphthylene diisocyanate, 1,5-naphthylene diisocyanate, 1,4 - tetramethylene diisocyanate, 1,6-hexamethylene diisocyanate, 1,10 - decamethylene diisocyanate, ω,ω′-diisocyanate dimethylbenzol, ω,ω′-dipropylether diisocyanate, octadecyl diisocyanate, 1,4-cyclohexylene diisocyanate, 4,4′-methylene-bis-(cyclohexyl isocyanate), 1,5-tetrahydronaphthylene diisocyanate, tolylenediisocyanate dimers, and the like.

The intermediate unsaturated polyester and the diisocyanate may be reacted at a mole ratio of about 1–2:1. For example, this reaction is carried out at a temperature of about 50° C. to 150° C. for about 60 to 300 minutes in air or an inert gas atmosphere such as nitrogen gas in the presence or absence of a catalyst. The catalysts include tertiary amines such as diethylcyclohexylamine and triethylenediamine, and organo-heavy-metal compounds soluble in the reaction system such as ferrous acetoacetate, dibutyltin dilaurate, stannous oleate and stannous octoate.

The unextended unsaturated polyesters can be produced by conventional processes. Usually an unsaturated polyester is formed by direct esterification, ester exchange or addition reaction between an alcoholic component comprising at least one polyol and acidic component comprising at least one unsaturated dicarboxylic acid and/or its anhydride and or dimethyl or diethyl ester thereof, and if desired, a saturated mono-, di-, or poly-carboxylic acid, unsaturated monocarboxylic acid anhydrides or methyl or ethyl esters thereof.

Exemplary unsaturated dicarboxylic acids, anhydrides and methyl or ethyl esters thereof utilized for the preparation of an unsaturated polyester include maleic acid, fumaric acid, citraconic acid, mesaconic acid, itaconic acid, glutaconic acid, muconic acid, aconitic acid, dimethyl or diethyl esters thereof, or anhydrides thereof, especially maleic anhydride, citraconic anhydride and itaconic anhydride.

Examples of suitable saturated dicarboxylic acids, anhydrides and methyl or ethyl esters thereof include oxalic acid, malonic acid, succinic acid, glutaric acid, adipic acid, pimelic acid, suberic acid, azelaic acid, sebacic acid, methyl malonic acid, methyl succinic acid, phthalic acid, isophthalic acid, terephthalic acid, dimethyl or diethyl esters thereof, and phthalic anhydride.

Examples of suitable diols which may be included in the unsaturated polyesters are ethyelne glycol, 1,2-propylene glycol, 1,3 - propanediol, 1,4-butanediol, diethylene glycol, dipropylene glycol, polyethylene glycols having an average molecular weight of at least about 150, polypropylene glycols having an average molecular weight of at least about 192, polybutylene glycols having an average molecular weight of at least about 162 and copoly (oxyethyleneoxypropylene) glycols having an average molecular weight of at least about 120.

In order to improve the mechanical strength of the unsaturated polyesters, various polyol and polycarboxylic acids having 3 or more functional groups may be used in addition to these diols and dicarboxylic acids. Exemplary polyols include glycerol, trimethylolpropane, erythritol, pentaerythritol, hexitol, and the like.

Also mono-functional and/or carboxylic acids may be used for blocking the terminal carboxyl group or hydroxy group. Examples of suitable mono-functional alcohols and carboxylic acids are methanol, propanol, butanol, allyl alcohol, acetic acid, propionic acid, acrylic acid, methacrylic acid, and the like.

The N-3-oxohydrocarbon-substituted acrylamides (i) of the formula

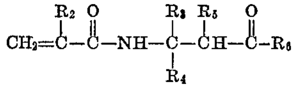

wherein $R_2$ represents a hydrogen atom or methyl group; and
$R_3$, $R_4$, $R_5$ and $R_6$ represents, respectively, a hydrogen atom, alkyl or cycloalkyl group having at most 10 carbon atoms, are employed for obtaining a desirable hardness, flexibility and water resistance after photopolymerization while maintaining a sufficient rate of photopolymerization. These compounds preserve the high reactivity of acrylamide, the 3-oxohydrocarbon group bonded to the nitrogen atom has a plasticizing effect in the photosensitive composition after photopolymerization, and the amide group reduces the hydrophilic character to render the photopolymerized product water resistant.

The N-3-oxohydrocarbon-substituted acrylamides may be prepared by reacting acrylonitrile or methacrylonitrile with a hydroxyketone or a hydroxy aldehyde in the presence of sulfuric acid and hydrolyzing the resulting compound according to U.S. Pat. No. 3,277,056.

Examples of suitable N-3-oxohydrocarbon-substituted acrylamides include N-3-oxopropyl acrylamide, N-3-oxobutyl acrylamide, N-3-oxo-1-methyl-butyl acrylamide, N-3-oxo-1-methyl-1,3-diethyl-propyl acrylamide, N-3-oxo-1,1-dimethyl-butyl acrylamide, N-3-oxo-methyl-1,3-dicyclohexyl-propyl acrylamide, N-3-oxo-1,5-dimethyl-1-isopropyl-hexyl acrylamide, N-3-oxo-1,1-diisobutyl-2-isopropyl-5-methyl-hexyl acrylamide, N-3-oxo-1,1-dibutyl-2-n-propyl-heptyl acrylamide, N-3-oxo-1-methyl-butyl alpha-methyl acrylamide, and N-3-oxo-1,1-dimethyl-butyl alpha-methyl acrylamide, and the like.

These N-3-oxohydrocarbon-substituted acrylamides are preferably used in an amount of from about 1 to 50 parts by weight based upon 100 parts by weight of the unsaturated polyester. When the amount is less than about 1 part by weight, the desired effects are hardly realized. On the other hand, amounts of more than about 50 parts by weight frequently produce non-homogeneous mixture resulting in stratification and opacity in the end products.

The compounds (ii) of the formula

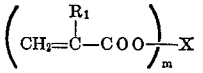

wherein $R_1$ represents a hydrogen or methyl group;
$m$ is an integer of 2 to 4; and
X represents a radical of polyol having $m$ terminal hydroxy groups and an average molecular weight of at most about 1,000, are employed for increasing tensile strength of the photopolymerized compositions. When $m$ is 1 in the above formula, it is difficult to obtain adequate tensile strength after photopolymerization. On the other hand if *m* is more than 4, the photopolymerized articles tend to become brittle. Also when the average molecular weight of X in the above formula is more than about 1,000 the rate of photopolymerization is reduced without corresponding increase in the tensile strength after photopolymerization.

Examples of suitable compounds (ii) include ethyleneglycol di-acrylate or -methacrylate, diethyleneglycol di-acrylate or -methacrylate, triethyleneglycol di-acrylate or -methacrylate, tetraethyleneglycol di-acrylate or methacrylate, polyethyleneglycol (average molecular weight: 200 to 1,000) di-acrylate or -methacrylate, propyleneglycol di-acrylate or -methacrylate, dipropyleneglycol di-acrylate or -methacrylate, polypropyleneglycol (average molecular weight: 100 to 1,000) di-acrylate or -methacrylate, butyleneglycol di-acrylate or -methacrylate, trimethylolethane tri-acrylate or -methacrylate, trimethylolpropane tri-acrylate or -methacrylate and pentaerythritol tetra-acrylate or -methacrylate.

In order to obtain a sufficient tensile strength of the photopolymerized articles, it is preferred to employ the compound (ii) in an amount of about 10 to 100 parts by weight based upon 100 parts by weight of polyester. When the amount is more than about 100 parts by weight, the elongation decreases and the photopolymerized articles, though hard, become brittle. Advantageously, the compound (ii) is present in an an amount greater than compound (i), preferably from about 2 to up to about 10 times the amount of compound (i).

In order to increase the elongation after photopolymerization, it is preferred that the photosensitive composition of this invention additionally contains a compound of the formula

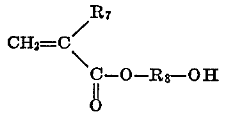

wherein $R_7$ represents a hydrogen atom or methyl group; and
$R_8$ represents the residue of a diol having an average molecular weight of at most about 200 excluding the hydroxy groups.

When the average molecular weight of $R_8$ is more than about 200, the compound retards the rate of photopolymerization in some cases and is not preferred for the present invention. As compared with an ester of a monoalcohol and acrylic acid or methacrylic acid, such compound (iii) usually has a higher boiling point with almost no offensive odor and results in an increase in elongation while maintaining the strength of the product after photopolymerization.

Examples of suitable compounds (ii) include 2-hydroxyethyl acrylate, 2-hydroxyethyl methacrylate, 2-hydroxypropyl acrylate, 2-hydroxypropyl methacrylate, 3-chloro-2-hydroxypropyl acrylate, 3-chloro-2-hydroxypropyl methacrylate, 4-hydroxybutyl acrylate, 4-hydroxybutyl methacrylate, diethyleneglycol monoacrylate, diethyleneglycol monomethacrylate, dipropyleneglycol monoacrylate, dipropyleneglycol monomethacrylate, polyethyleneglycol (average molecular weight: about 150 to 200) monoacrylate, polyethyleneglycol (average molecular weight: about 150 to 200) monoethacrylate, polypropyleneglycol (average molecular weight: about 150 to 200) monoacrylate and polypropyleneglycol (average molecular weight: about 150 to 200) monomethacrylate.

These compounds are preferably used in an amount of from about 1 to 50 parts by weight per 100 parts by weight of the unsaturated polyester in order to improve the elongation of the photopolymerized articles.

Furthermore, in order to increase the surface hardness of the photopolymerized articles it is preferred to employ an amide (iv) of the formula;

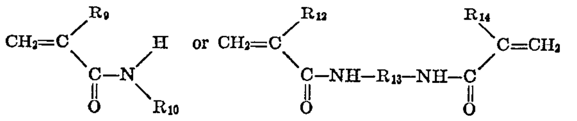

wherein $R_9$, $R_{12}$ and $R_{14}$ each independently is a hydrogen atom or methyl group;
$R_{10}$ represents a hydrogen atom or a $—CH_2OR_{11}$ group wherein
$R_{11}$ represents a hydrogen atom or a lower alkyl group having up to 4 carbon atoms; and
$R_{13}$ represents an alkylene group having up to 6 carbon atoms.

When $R_{11}$ has more than 4 carbon atoms or when $R_{13}$ has more than 6 carbon atoms in some instances the surface hardness of the photopolymerized articles is not improved.

Examples of suitable amides (iv) include acrylamide,
methacrylamide,
N-methylolacrylamide,
N-methylolmethacrylamide,
N-methoxymethylacrylamide,
N-methoxymethylmethacrylamide,
N-ethoxymethylacrylamide,
N-ethoxymethylmethacrylamide,
N-n-propoxymethylacrylamide,
N-isopropoxymethylmethacrylamide,
N-n-butoxymethylacrylamide,
N-isobutoxymethylmethacrylamide
N,N'-methylenebisacrylamide,
N,N'-methylenebismethacrylamide,
N,N'-trimethylenebisacrylamide,
N,N'-trimethylenebismethacrylamide,
N,N'-hexamethylenebisacrylamide,
N,N'-hexamethylenebismethacrylamide, and the like.

The amides are preferably used in an amount of from about 1 to 25 parts by weight per 100 parts by weight of the unsaturated polyester. When the amount is less than 1 part, it does not significantly improve the surface hardness of the photopolymerized articles. On the other hand, amounts of more than about 25 parts by weight result in diminished compatibility with other components of the photosensitive compositions and embrittle the photopolymerization product.

In addition, in order to improve the properties of the photosensitive compositions before photopolymerization such as transparency and viscosity, and those after photopolymerization such as ink resistance, it is preferred to employ one other ethylenically unsaturated compound (v).

Examples of suitable other ethylenically unsaturated compounds include acrylic acid, methacrylic acid, methyl acrylate, ethyl acrylate, n-propyl acrylate, isopropyl acrylate, n-hexyl acrylate, n-octyl acrylate, n-dodecyl acrylate, cyclohexyl acrylate, tetrahydrofurfuryl acrylate, allyl acrylate, glycidyl acrylate, styrene, vinyltoluene, divinylbenzene, carboxystyrene, diallylphthalate, triallylcyanurate, vinyl acerate, and the like.

The compounds (v) may be used in an amount up to about 20 parts by weight of the unsaturated polyester or the diisocyanate modified unsaturated polyester.

It is necessary that the reaction of photosensitive compositions is initiated only by the action of actinic light and they are thermally stable. Therefore, preferably polymerization initiators are thermally inactive below 40° C. and initiate photopolymerization upon irradiation with actinic light.

Exemplary photopolymerization initiators include benzoins such as benzoin, benzoin methyl ether, benzoin ethyl ether, benzoin isopropyl ether, alpha-methylbenzoin, alpha-ethylbenzoin, alpha-methyl benzoin methyl ether alpha-phenylbenzoin, alpha-allylbenzoin; anthraquinones such as anthraquinone, chloroanthraquinone, methylanthraquinone, ethylanthraquinone, tertiary butylanthraquinone; diketones such as benzil, diacetyl; phenones such as acetophenone, benzophenone, omega-bromoacetophenone; 2-naphthalene sulfonyl chloride; disulfides such as diphenyl disulfide, tetraethylthiouram disulfide; dyes such as Eosine G (C.I. 45380) and Thionine (C.I. 52025); and the like.

These photopolymerization initiators are preferably used in an amount of from about 0.0001 to 10 parts by weight per 100 parts by weight of the photosensitive composition. Amounts of photopolymerization initiator of more than about 10 parts by weight do not significantly increase the photopolymerization reaction and would be uneconomical and further tend to decrease the mechanical properties of photopolymerized products. On the other hand when the amount of the photopolymerization initiator is less than indicated, the photopolymerization reaction is greatly retarded and is too slow for practical commercial purposes.

Known stabilizers may be employed for the purpose of maintaining storage stability (shelf life) of the photosensitive compositions. Such stabilizers may be added when the components of the photosensitive composition are admixed or may be added to each component separately prior to admixing of the components.

Exemplary stabilizers include hydroquinone, mono-tert-butyl hydroquinone, 2,5-di-tert-butyl hydroquinone, catechol, tert-butyl catechol, benzoquinone, 2,5-diphenyl-p- benzoquinone, p-methoxy phenol, picric acid, cuprous chloride and a compound of the formula

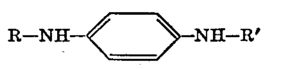

wherein

R and R′ are each selected from the group consisting of hydrogen, lower alkyl having 1 to 4 carbon atoms, phenyl and naphthyl such as p-phenylenediamine, N,N′-diphenyl-p-phenylenediamine, and the like.

These stabilizers are added only for preventing thermal polymerization without the actinic radiation set forth above without restraining the photopolymerization reaction. Consequently the amount of the stabilizers may be preferably about 0.001 to 2.0 percent by weight of the total weight of the photosensitive composition.

Furthermore, various compounds such as fillers and plasticizers may be incorporated into the photosensitive compositions in order to improve the mechanical properties after photopolymerization. These compounds include, for example, mica, glass fibers, glass cloth, fine powdery silicon oxides, alumina and calcium carbonate, talc, polyamides, polyesters, polyureas, polymethylmethacrylates, polystyrenes, polyvinylchlorides, polyvinylacetates, polybutadienes and cellulose esters. These compounds are used in such an amount as not to render the photosensitive compositions opaque.

The photosensitive compositions of this invention are photopolymerized by actinic radiation having wave lengths of 2,000 to 8,000 angstroms. Practical sources of such actinic radiation include carbon arc lamps, super high pressure mercury lamps, high pressure mercury lamps, low pressure mercury lamps, xenon lamps, ultra violet fluorescent lamps and sunlight.

When the photosensitive compositions of this invention are exposed to actinic light through a process transparency, e.g., a negative or positive film, the areas corresponding to the transparent image portions are photopolymerized in about 1 second to 60 minutes and the non-image areas, i.e. unexposed areas, remain substantially unphotopolymerized. These non-exposed areas may be washed away with a solvent liquid such as water, an aqueous solution or an organic solvent. Exemplary solvent liquids include aqueous solutions of sodium hydroxide, potassium hydroxide, calcium hydroxide, ammonium hydroxide, sodium carbonate, sodium bicarbonate, potassium carbonate, hydrochloric acid, sulfuric acid, nitric acid, acetic acid; aqueous solutions of methanol, ethanol, isopropanol and acetone; methanol, ethanol, isopropanol, acetone, methylethyl ketone, ethyl acetate, butyl acetate, dioxane, tetrahydrofurane, phenol, ether, benzene, toluene, gasoline, kerosene, light oil, trichloroethylene or the mixtures thereof.

For example a relief printing plate may be prepard by placing a process transparency, e.g., a negative film on a glass sheet transparent to actininc light, covering the negative film with a film transparent to actinic light such as polyester film, depositing the photosensitive composition upon the film to form a layer of 0.1 mm. to 10 mm. in thickness, placing a base or support material such as polyester film on the layer according to the process and apparatus described in German DOS Pat. No. 2,029,238, putting a glass sheet transparent to actinic light on the support material, exposing the resulting assembly to actinic light, first from the support material side, second from the negative film side or simultaneously from the support material side and the negative film side or from the negative film side in case of metal support materials or opaque support materials, removing the glass sheets, the negative film and the film covering the negative film from the assembly, washing out the unexposed portions of the layer, drying the resulting relief printing plate and, if necessary, postexposing the whole relief printing plate.

Examples of suitable base or support materials include metals such as steel and aluminum plates, sheets and foils and plastics such a polyeter, polyamide, polyvinylchloride, polyvinylidenechloride, polymethylmethacrylate, polystyrene and cellulose ester films and plates. These support materials may be either transparent or opaque to actinic light. The thickness of these support materials is preferably in the range of 0.1 mm. to 2.0 mm. for metal plates, sheets and foils and preferably in the range of 50 microns to 2 mm. for plastic films and plates.

Also an adhesive anchor layer may be provided on such support materials. The adhesive anchor layer is composed of a synthetic resin or polymer such as alkyl resins, urethane resins, epoxy resins, melamine resins and synthetic rubbers. The thickness of the adhesive anchor layer is preferably in the range of 0.1 micron to 0.3 mm. The adhesive anchor layer may contain a photopolymerization initiator when transparent support materials are used as described in German DOS Pat. No. 2,031,476.

A light absorptive layer may be provided between a light-reflective support and a photosensitive composition. Suitable materials are pigments and dyes which do not migrate or bleed into the photosensitive composition layer. Examples of suitable pigments are iron oxides such as Indian red, Venetian red, ocher, umber, sienna, iron black, lead chromate, lead molybdate, cadmium yellow, cadmium red, chrome green, iron blue, manganese black and various carbon blacks.

This invention will now be illustrated by the following examples in which parts are all by weight unless expressly stated to contrary.

EXAMPLE 1

Under an atmosphere of nitrogen gas, 2 moles of fumaric acid, 2 moles of adipic acid, 2 moles of diethyleneglycol and 2 moles of propyleneglycol were reacted at the maximum temperature of 190° C. for about 10 hours in the presence of 0.5 g. of p-toluenesulfonic acid as catalyst and 0.2 g. of hydroquinone anti-gellation agent to produce an unsaturated polyester (I) having an average molecular weight of 3,100, an acid value of 18 and an ethylenic double bond equivalent of 372. To 100 parts of the unsaturated polyester, there were added various amounts of acrylic acid, diethyleneglycol dimethacrylate and N-3-oxo-1, 1-dimethyl-butyl acrylamide as shown in Table 1, 2 parts of benzoin and 0.1 part of hydroquinone to produce photosensitive compositions. A spacer of 1 mm. in thickness was inserted between 2 transparent glass sheets and each resulting photosensitive composition was charged there-between and exposed at room temperature for 10 minutes to 5 ultra violet fluorescent lamps (made by Tokyo Shibaura Electric Co., Ltd. FL20BL) set at a distance of 10 cm. from the glass to photopolymerize the mass. The mechanical properties and water absorption of the photosensitive composition after photopolymerization were measured. The results are shown in Table 1. From Table 1 it is understood that the photosensitive composition C has excellent mechanical properties after photopolymerization but is very poor in water resistance and consequently it is not suitable for practical purposes, while the photopolymerized article prepared from the photosensitive composition B is improved in water resistance relative to the photosensitive composition C. However, the photosensitive composition B has too high a Young's modulus after photopolymerization. When the photopolymerized article prepared from the photosensitive composition B is bent at a right angle, it is easily and readily broken and therefore it is hard but brittle. Contrary to these photosensitive compositions B and C, the photosensitive composition A maintains the hardness and water absorption of the photosensitive composition B and, remarkably, exhibits a decreased Young's modulus with an increase in elongation. When the photopolymerized article prepared from the photosensitive composition A is bent at a right angle, it is not broken and is very flexible.

On a transparent glass sheet, 10 mm. in thickness, there was placed a 390 mm. x 550 mm. negative film for newspaper. Then the negative film was covered with a polyester cover film 12 microns in thickness and the photosensitive compositions of A to C were squeezed with a doctor blade on the film to form a layer of the photosensitive compositions 0.6 mm. in thickness. One side of a polyester base film, 100 microns in thickness was coated with a polyurethane resin (made by Sanyo Chemical Co., Ltd.: GA–83) to about 5 microns in thickness and the coated side of the film was laminated to the layer of the photosensitive composition, and then a transparent glass sheet, 5 mm. in thickness, was placed thereupon. The outside of the transparent glass sheet was exposed for 12 seconds to 10 ultra violet fluorescent lamps (made by Tokyo Shibaura Electric Co., Ltd.: FL–20BL) set at a distance of 10 cm. from the glass and subsequently the transparent glass sheet was exposed for 60 seconds (photosensitive compositions A and C) and for 80 seconds (photosensitive composition B) to a 3 kw. super high pressure mercury lamp set at a distance of 50 cm. After exposure the two glass sheets and the polyester cover film were removed and the photopolymerized layer on the polyester base film, was washed for about 2 minutes with a 0.5% sodium hydroxide solution, further for 30 seconds with water, and dried, and the whole plate was postexposed for one minute to the same ultra violet fluorescent lamps to produce a printing plate for newspaper.

The fine lines and dots of the printing plate prepared from the photosensitive composition C were broken down because the printing plate absorbed water and became weak during washing. Furthermore, although the relief was hard immediately after postexposure, the photographic portions and the large solid portions were markedly curled and the peripheral part of the photographic portions were elevated in comparison with the central part and consequently the printing plate as such could not be fixed on the saddle of a rotary press. When this printing plate was left to stand for about one hour in a room at a relative humidity of about 75 percent, the printing plate was rapidly softened and curled due to water absorption and the reproducibility of the image portions in printing was deteriorated.

On the printing plate prepared from the photosensitive composition B, fine lines and dots were barely formed but the non-image portions between line and line or between dot and dot were not removed completely and the printing plate was markedly curled as in the printing plate prepared from the photosensitive composition C.

The printing plate prepared from the photosensitive composition A had sharp image portions precisely corresponding to the negative film and the curling of the printing plate was extremely reduced and clear prints were obtained by using this printing plate.

Thus, th photosensitive composition A improved both the water absorption of the photosensitive composition C remarkably and the brittleness of the photosensitive composition B and maintained the tensile elongation and hardness of the photosensitive composition B. Additionlly, the reproducibility of the image portions of the negative film according to the printing plate prepared from the photosensitive composition A was much sharper than that according to the printing plate prepared from the photosensitive compositions B and C.

TABLE 1

| Photo sensitive composition | Ethylenically unsaturated compound (parts) | | Properties after photopolymerization: Tensile strength (kg./cm.²) | Tensile elongation (percent) | Young's modulus (kg./cm.²) | Shore hardness D | Water absorption* (percent) |
|---|---|---|---|---|---|---|---|
| A | Diethyleneglycol dimethacrylate | 45 | 258 | 25 | 3,700 | 67 | 7.1 |
| | N-3-oxo-1,1-dimethylbutyl acrylamide | 15 | | | | | |
| | Acrylic acid | 0 | | | | | |
| B (comparison) | Diethyleneglycol dimethacrylate | 60 | 270 | 10 | 8,600 | 70 | 6.5 |
| | N-3-oxo-1,1-dimethylbutyl acrylamide | 0 | | | | | |
| | Acrylic acid | 0 | | | | | |
| C (comparison) | Diethyleneglycol dimethacrylate | 0 | 263 | 105 | 6,800 | 65 | 63.2 |
| | N-3-oxo1,1-dimethylbutyl acrylamide | 0 | | | | | |
| | Acrylic acid | 60 | | | | | |

* Water absorption: Calculated after immersing a photopolymerized product in water at 20°C for 24 hours according to the following equation:

$$\text{Water absorption (percent)} = \frac{\text{Weight after immersion} - \text{weight before immersion}}{\text{Weight before immersion}} \times 100$$

EXAMPLES 2 TO 11

Photosensitive compositions were prepared in the same manner as in Example 1(A) except that N-3-oxo-1,1-dimethylbutyl acrylamide in the photosensitive composition A was replaced by a variety of N-3-oxohydrocarbon-substituted acrylamides set forth in Table 2 and each resulting photosensitive composition was photopolymerized in the same manner as in Example 1. The properties of the photopolymerized articles were measured and the results are shown in Table 2.

TABLE 2

| Example No. | N-3-oxohydrocarbon-substituted acrylamide | Tensile strength (kg./cm.²) | Tensile elongation (percent) | Young's modulus (kg./cm.²) | Shore hardness D | Water absorption (percent) |
|---|---|---|---|---|---|---|
| 2 | N-3-oxopropyl acrylamide | 265 | 31 | 4,200 | 68 | 10.0 |
| 3 | N-3-oxobutyl acrylamide | 255 | 30 | 4,000 | 53 | 10.2 |
| 4 | N-3-oxo-1-methyl-butyl acrylamide | 238 | 26 | 3,700 | 50 | 8.9 |
| 5 | N-3-oxo-1-methyl-1,3-dicyclohexyl-propyl acrylamide | 201 | 24 | 3,100 | 36 | 4.3 |
| 6 | N-3-oxo-1-methyl-1,3-diethyl-propyl acrylamide | 230 | 25 | 3,400 | 41 | 6.9 |
| 7 | N-3-oxo-1,5-dimethyl-1-isopropyl-hexyl acrylamide | 226 | 33 | 2,750 | 39 | 6.8 |
| 8 | N-3-oxo-1,1-diisobutyl-2-isopropyl-5-methyl-hexyl acrylamide | 214 | 22 | 3,150 | 38 | 5.5 |
| 9 | N-3-oxo-1,1-dibutyl-2-n-propyl-heptyl acrylamide | 208 | 23 | 3,000 | 40 | 5.8 |
| 10 | N-3-oxo-1-methyl-butyl alpha-methyl acrylamide | 247 | 25 | 3,800 | 52 | 8.6 |
| 11 | N-3-oxo-1,1-dimethyl-butyl alpha-methyl acrylamide | 242 | 25 | 3,600 | 48 | 8.4 |

EXAMPLES 12 TO 17

2 moles of adipic acid, 1 mole of phthalic anhydride, 1 mole of maleic anhydride, 1 mole of propyleneglycol and 3 moles of diethyleneglycol were polycondensed in the same manner as in Example 1 to produce an unsaturated polyester (II) having an average molecular weight of 2,000, an acid value of 28 and an ethylenic double bond equivalent of 824. To 100 parts of the unsaturated polyester thus obtained, there were added various amounts of triethyleneglycol diacrylate, N-oxo-1,1-dimethyl-butyl acrylamide, 2-naphthalenesulfonyl chloride and p-methoxyphenol as set forth in Table 3 to produce photosensitive compositions. Each resulting photosensitive composition was photopolymerized in the same manner as in Example 1 and the mechanical properties and water absorption were measured. The results are shown in Table 3. It is understood from Table 3 that such small amounts of N-3-oxo-1,1-dimethyl-butyl acrylamide as in Examples 12 to 14 lower the Young's modulus of the photopolymerized articles and 100 parts of N-3-oxo-1,1-dimethyl-butyl acrylamide based upon 100 parts of the unsaturated polyester as in Examples 15 to 17 increase the hardness of the photopolymerized articles. The tensile elongation of the photopolymerized article of Example 15 is very low while those of Examples 16 and 17 are much increased. The photosensitive compositions of Examples 12 and 15 have a slightly poor dispersibility and solubility in a 0.5% sodium hydroxide solution while those of Examples 13, 14, 16 and 17 have a good dispersibility and solubility in the solution.

TABLE 3

| Example No. | Photosensitive composition | | | | Properties of photopolymerized article | | | | |
|---|---|---|---|---|---|---|---|---|---|
| | Triethyleneglycol diacrylate (parts) | N-oxo-1,1-dimethyl-butyl acrylamide (parts) | 2-naphthalene-sulfonyl chloride (parts) | p-Methoxyphenol (parts) | Tensile strength (kg./cm.²) | Tensile elongation (percent) | Young's modulus (kg./cm.²) | Shore hardness D | Water absorption (percent |
| 12 (comparison) | 50 | 0 | 1.5 | 0.1 | 182 | 6 | 6,500 | 68 | 4.3 |
| 13 | 50 | 1 | 1.5 | 0.1 | 180 | 8 | 5,900 | 68 | 4.3 |
| 14 | 50 | 5 | 1.5 | 0.1 | 179 | 11 | 4,600 | 67 | 4.5 |
| 15 (comparison) | 100 | 0 | 3 | 0.2 | 290 | 2 | 16,300 | 80 | 6.7 |
| 16 | 100 | 20 | 3 | 0.2 | 295 | 15 | 12,400 | 77 | 6.9 |
| 17 | 100 | 40 | 3 | 0.2 | 282 | 21 | 6,800 | 76 | 7.1 |

Then, a spacer of 2 mm. in thickness was inserted between two transparent glass sheets, each 1 mm. in thickness, and the photosensitive compositions of Examples 12 to 17 were charged therebetween, respectively. One side of the transparent glass sheets was exposed for 30 seconds to a 3 kw. super high pressure mercury lamp set at a distance of 50 cm. from the glass. Subsequently the other side of the transparent glass sheets was removed and the photosensitive composition layer was washed out with a 0.5% sodium hydroxide solution, dried and subjected to postexposure. The thickness of the photopolymerized layer was measured. The results are shown in Table 4.

Table 4

| Example No.: | Thickness of polymerized layer (mm.) |
|---|---|
| 12 (comparison) | 0.19 |
| 13 | 0.36 |
| 14 | 0.39 |
| 15 (comparison) | 0.15 |
| 16 | 0.33 |
| 17 | 0.44 |

As is clear, the rate of photopolymerization of the photopolymerization of the photosensitive compositions of Examples 12 and 15 which do not contain N-3-oxo-1,1-dimethyl-butyl acrylamide, is remarkably low.

EXAMPLE 18

Printing plates were produced by using the photosensitive compositions of Examples 15 and 16.

On a transparent glass sheet, 10 mm. in thickness, there was placed a 390 mm. x 550 mm. negative film for newspaper and the negative film was covered with a polyester film 12 microns in thickness and a layer of the photosensitive composition 0.6 mm. in thickness was provided on the polyester film. One side of an aluminum sheet, 0.2 mm. in thickness, was coated with a polyurethane resin (made by Sanyo Chemical Co., Ltd.: GA-83) containing 0.5 percent by weight of red ocher rouge and the coated side of the aluminum plate was placed on the layer of the photosensitive composition. Then the glass sheet was exposed for 5 minutes to a KW super high pressure mercury lamp set at a distance of 50 cm. and a printing plate for newspaper was obtained in the same manner as in Example 1.

The resulting printing plate prepared from the photosensitive composition of Example 15 was markedly curled in the parts of the photographic portions and large solid portions and predominantly the non-image portions between line and line or dot and dot were not washed out completely. On the other hand the printing plate prepared from the photosensitive composition of Example 16 was flat and the non-image portions were completely washed out and the reliefs were sharp.

EXAMPLES 19 TO 23

3 moles of adipic acid, 1 mole of isophthalic acid, 1 mole of fumaric, 2 moles of ethyleneglycol and 3 moles of polypropyleneglycol having an average molecular weight of 300 were polycondensed in the same manner as in Example 1 to produce an unsaturated polyester (III) having an average molecular weight of 2,950 and an acid value of 19 and an ethylenic double bond equivalent of about 1570. To 100 parts of the resulting unsaturated polyester, there were added 45 parts of ethyleneglycol, 15 parts of N-3-oxo-1,1-dimethyl-butyl acrylamide, varied amounts of 2-hydroxy propyl methacrylate as shown in Table 5, 2 parts of benzoin ethylether and 0.1 part of catechol to produce photosensitive compositions. Each resulting photosensitive composition was photopolymerized in the same manner as in Example 1 and the mechanical properties and water absorption of the photopolymerized articles were measured. The results are shown in Table 5. As is clear from Table 5, by adding 2-hydroxy propyl methacrylate to the photosensitive composition, it is possible to improve the tensile elongation while maintaining the tensile strength and to decrease both the Young's modulus and hardness. The printing plates prepared from the photosensitive compositions of Examples 20 to 23 have a flexibility especially suitable for flexographic printing. Using these printing plates corrugated cardboards were clearly and precisely printed.

TABLE 5

| Example No. | 2-hydroxy propyl methacrylate (parts) | Properties of photopolymerized article: Tensile strength (kg./cm.²) | Tensile elongation (percent) | Young's modulus (kg./cm.²) | Shore hardness A | Water absorption (percent) |
|---|---|---|---|---|---|---|
| 19 | 0 | 135 | 43 | 2,200 | 85 | 8.2 |
| 20 | 2.5 | 137 | 51 | 1,900 | 80 | 8.3 |
| 21 | 5 | 141 | 55 | 1,780 | 76 | 8.4 |
| 22 | 10 | 140 | 60 | 1,420 | 70 | 8.6 |
| 23 | 20 | 138 | 64 | 1,260 | 64 | 8.8 |

EXAMPLES 24 TO 26

To 100 parts of the unsaturated polyester (I) obtained in Example 1, there were added varied amounts of ethyleneglycol dimethacrylate as set forth in Table 6, 5 parts of N-3-oxo-1,1-dimethyl-butyl acrylamide, 20 parts of 2-hydroxyethyl methacrylate, 0.2 part of 2-ethylanthraquinone and 0.1 part of p-methoxyphenol to produce photosensitive compositions. Each resulting photosensitive composition was photopolymerized in the same manner as in Example 1 and the mechanical properties and water absorption were measured. The results are shown in Table 6. As is clear from Table 6, the photopolymerized article prepared from the photosensitive composition of Example 24 (i.e. not containing ethyleneglycol dimethacrylate) is very brittle and not suitable as a printing plate.

TABLE 6

| Example No. | Ethyleneglycol dimethacrylate (parts) | Properties of photopolymerized article: Tensile strength (kg./cm.²) | Tensile elongation (percent) | Young's modulus (kg./cm.²) | Shore hardness D | Water absorption (percent) |
|---|---|---|---|---|---|---|
| 24 (comparision) | 0 | 35 | 5 | 80 | <10 | 93 |
| 25 | 20 | 87 | 18 | 1,200 | 35 | 11 |
| 26 | 40 | 160 | 23 | 1,800 | 45 | 8 |

EXAMPLES 27 TO 30

Unsaturated polyesters (IV), (V), (VI) and (VII) were produced in the same manner as in Example 1 except that the moles of fumaric acid and adipic acid were varied. Then using each resulting unsaturated polyester, photosensitive compositions were prepared in the same manner as in Example 16. Each photosensitive composition thus obtained was photopolymerized in the same manner as in Example 1 and the mechanical properties and water absorption were measured. The results are shown in Table 7. It is clearly understood that the unsaturated polyesters having at least one ethylenic double bond in the molecule and an ethylenic double bond equivalent of no more than about 3,200 give much more preferable properties to the photopolymerized articles than the saturated polyester.

TABLE 7

| Example No. | Unsaturated polyester: Fumaric acid (mole) | Adipic acid (mole) | Acid value | Average molecular weight | Ethylenic double bond equivalent | Properties of photopolymerized article: Tensile strength (kg./cm.²) | Tensile elongation (percent) | Young's modulus (kg./cm.²) | Shore hardness D | Water absorption (percent) |
|---|---|---|---|---|---|---|---|---|---|---|
| 27 (comparison) | 0 | 4 | 14 | 4,010 | 0 | 43 | 5 | 220 | 10 | 28 |
| 28 | 0.25 | 3.75 | 14 | 4,010 | 3,186 | 76 | 13 | 1,200 | 30 | 14 |
| 29 | 0.5 | 3.5 | 15 | 3,740 | 1,578 | 142 | 16 | 1,830 | 50 | 11 |
| 30 | 1 | 3 | 17 | 3,300 | 774 | 185 | 17 | 2,270 | 60 | 7 |

EXAMPLES 31 TO 33

Unsaturated polyesters (VIII), (IX) and (X) were produced in the same manner as in Example 1 except that the moles of fumaric acid and adipic acid and the reaction time were varied. Then using each resulting unsaturated polyester, photosensitive compositions were prepared in the same manner as in Example 22. Each photosensitive composition was photopolymerized in the same manner as in Example 1 and the mechanical properties and water absorption were measured. The results are shown in Table 8. It is understood from Table 8 that the average molecular weight of unsaturated polyesters is preferably 400 or more.

TABLE 8

| Example No. | Unsaturated polyester: Fumaric acid (mole) | Adipic acid (mole) | Acid value | Average molecular weight | Ethylenic double bond equivalent | Properties of photopolymerized article: Tensile strength (kg./cm.²) | Tensile elongation (percent) | Young's modulus (kg./cm.²) | Shore hardness A | Water absorption (percent) |
|---|---|---|---|---|---|---|---|---|---|---|
| 31 | 4 | 0 | 56 | 1,000 | 171 | 220 | 12 | 2,600 | 55 | 9 |
| 32 | 4 | 0 | 125 | 450 | 171 | 163 | 10 | 1,900 | 52 | 11 |
| 33 (comparison) | 4 | 0 | 156 | 360 | 171 | 67 | 2 | 1,200 | 20 | 18 |

EXAMPLE 34

1 mole of fumaric acid, 0.75 mole of adipic anhydride, 0.25 mole of phthalic anhydride and 3 moles of polyethyleneglycol having an average molecular weight of 600 were polycondensed for 18 hours in the same manner as in Example 1 to produce a substantially hydroxy-terminature unsaturated polyester (XI) having an acid value of 0.8, an average molecular weight of about 2,000 and an ethylenic double bond equivalent of about 2,000. 1,000 parts of unsaturated polyester thus obtained were maintained at 60° C. under an atmosphere of nitrogen gas and 78 parts of 2,4-tolylene diisocyanate were added thereto dropwise over one hour with vigorous stirring. The temperature slowly rises to 90° C. and then the reaction mixture was left to stand at 60° C. for 24 hours to give a diisocyanate modified unsaturated polyester having an average molecular weight of about 21,500. To 100 parts of the resulting diisocyanate modified unsaturated polyester, there were added 30 parts of triethyleneglycol diacrylate, 5 parts of 3-chloro-2-hydroxypropyl methacrylate, 5 parts of N-3-oxo-1-methyl-1,3-dicyclohexyl-propyl acrylamide, 5 parts of acrylamide, 3 parts of benzoin methylether and 0.1 part of 2,5-di-tert-butyl hydroquinone to produce a photosensitive composition. Using this photosensitive composition there was obtained an elastic flexographic printing plate in the same manner as in Example 1 and using this printing plate in flexographic printing was run to give more than 500,000 prints bearing precise and clear images.

EXAMPLE 35

1,000 parts of the unsaturated polyester (IX) obtained in Example 32 were reacted at 100° C. for 2 hours with 38 parts of hexamethylene diisocyanate to produce a diisocyanate modified unsaturated polyester. To 100 parts of the resulting diisocyanate modified unsaturated polyester, there were added 20 parts of ethyleneglycol dimethacrylate, 20 parts of N-3-oxo - 1,1 - dimethyl-butyl acrylamide, 20 parts of 2-hydroxyethyl methacrylate, 0.2 part of 2-ethylanthraquinone and 0.1 part of methoxyphenol to produce a photosensitive composition. The resulting photosensitive composition was photopolymerized in the same manner as in Example 1 and the mechanical properties and water absorption were measured. The results are as follows:

| | |
|---|---|
| Tensile strength (kg./cm.$^2$) | 180 |
| Tensile elongation (percent) | 13 |
| Young's modulus (kg./cm.$^2$) | 2,050 |
| Shore hardness D | 53 |
| Water absorption (percent) | 8 |

EXAMPLE 36

1,000 parts of the unsaturated polyester (VII) obtained in Example 30 were reacted at 100° C. for 2 hours with 3.8 parts of hexamethylene diisocyanate to produce a diisocyanate modified unsaturated polyester. To 100 parts of the resulting diisocyanate modified unsaturated polyester, there were added 30 parts of triethyleneglycol diacrylate, 5 parts of 3-chloro - 2 - hydroxypropyl methacrylate, 5 parts of N-3-oxo - 1 - methyl - 1,3 - dicyclohexyl-propyl acrylamide, 5 parts of acrylamide, 3 parts of benzoin methylether and 0.1 part of 2,5-di-tert-butyl hydroquinone to produce a photosensitive composition. The resulting photosensitive composition was photopolymerized in the same manner as in Example 1 and the mechanical properties and water absorption were measured. The results are as follows:

| | |
|---|---|
| Tensile strength (kg./cm.$^2$) | 163 |
| Tensile elongation (percent) | 25 |
| Young's modulus (kg./cm.$^2$) | 1,560 |
| Shore hardness D | 52 |
| Water absorption (percent) | 12 |

EXAMPLE 37

To 100 parts of the unsaturated polyester (VIII) obtained in Example 31, there were added 30 parts of polyethyleneglycol (average molecular weight: 600) diacrylate, 5 parts of N-3-oxo - 1,1 - dimethyl-butyl acrylamide, 10 parts of 2-hydroxyethyl acrylate, 5 parts of acrylamide, 3 parts of acrylic acid, 3 parts of benzoin and 0.1 part of tert-butyl catechol to produce a photosensitive composition. A printing plate for newspaper was prepared from the photosensitive composition in the same manner as in Example 1 and a rotary printing for newspaper was run using this printing plate to give about 700,000 prints and any deformation and damage of the relief image was not observed. This printing plate may be assumed to have a printing resistance of at least 1,000,000 prints.

EXAMPLE 38

To 100 parts of the diisocyanate modified unsaturated polyester obtained in Example 34, there were added 35 parts of trimethylolpropane triacrylate, 5 parts of 2-hydroxyethyl acrylate, 10 parts of N-3-oxo-1-methyl-1,3-dicyclohexyl-propyl acrylamide, 3 parts of benzoin methylether and 0.1 part of 2.5-di-tert-butyl hydroquinone to produce a photosensitive composition. Also to 100 parts of the diisocyanate modified unsaturated polyester obtained in Example 34, there were added 10 parts of pentaerythyritol methacrylate, 30 parts of 3-chloro-2-hydroxypropyl methacrylate, 5 parts of N-3-oxo-1,1-dimethyl-butyl acrylamide, 5 parts of N-methylolacrylamide, 3 parts of benzoin methylether and 0.1 part of 2,5-di-tert-butyl hydroquinone to produce a photosensitive composition. Using these photosensitive compositions there were obtained elastic flexographic printing plates and a flexographic printing was run to give more than 500,000 prints bearing precise and clear images.

The relief structures produced in accordance with the invention, as noted, are characterized by markedly superior combination of physical properties, e.g. a particularly desirable level of one property is not achieved by diminishing another property to an unacceptable extent. Thus, many of the novel structures are characterized by a tensile strength of at least about 75 kg./cm.$^2$, a tensile elongation of about 8 to 65%, a Young's Modulus of about 1,000 to 7,000 kg./cm.$^2$, a Shore hardness D of at least about 30 and a water absorption of less than about 15% by weight. A preferred sub-group of relief structures are even superior, having a tensile strength of at least about 150 kg./cm.$^2$, a tensile elongation of about 15 to 35%, a Young's Modulus of about 1,500 to 4,000 kg./cm.$^2$, a Shore hardness D of at least about 50 and a water absorption of less than about 10% by weight.

It will be appreciated that the instant specification and examples are set forth by way of illustration and not limitation, and that various modifications and changes may be made without departing from the spirit and scope of the present invention.

What is claimed is:

1. A photosensitive composition comprising (A) about 100 parts by weight of an unsaturated polyester produced from an alcoholic component comprising at least one polyol and an acidic component comprising at least one unsaturated dicarboxylic acid, its anhydride or its methyl or ethyl ester and having an average molecular weight of about 400 to 30,000 and an ethylenic double bond equivalent of about 160 to 3,200 (B) about 1 to 50 parts by weight of an ethylenically unsaturated Compound (i) of the formula

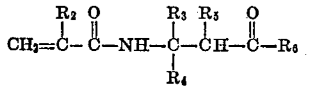

wherein $R_2$ represents a hydrogen atom or methyl group, $R_3$, $R_4$, $R_5$ and $R_6$ represent a hydrogen atom, an alkyl group or cycloalkyl group having at most 10 carbon atoms, and about 10 to 100 parts by weight of a Compound (ii) of the formula $$\left(CH_2{=}\overset{R_1}{\overset{|}{C}}{-}COO\right)_m X$$

wherein $R_1$ represents a hydrogen atom or methyl group;
$m$ is an integer from 2 to 4; and
X represents a radical of a polyol having a molecular weight of at most 1,000 and $m$ terminal hydroxy groups from which the terminal hydroxy groups are excluded, and (C) about 0.0001 to 10 parts by weight of a photopolymerization initiator.

2. A photosensitive composition as claimed in claim 1, containing about 1 to 50 parts by weight of a Compound (iii) of the formula

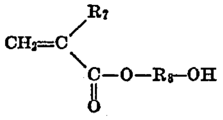

wherein $R_7$ represents a hydrogen atom or methyl group; and
$R_8$ represents a residue of diol having an average molecular weight of at most 200 from which the hydroxy groups are excluded.

3. A photosensitive composition as claimed in claim 1 containing about 1 to 25 parts by weight of an amide (iv) of the formula

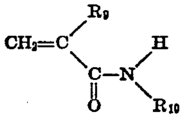

or

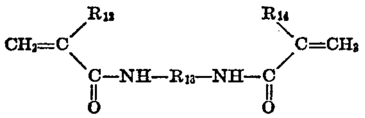

wherein $R_9$, $R_{12}$ and $R_{14}$ represent a hydrogen atom or methyl group respectively,
$R_{10}$ represents a hydrogen atom or a $-CH_2OR_{11}$ group wherein $R_{11}$ represents a hydrogen atom or an alkyl group having up to 4 carbon atoms, and
$R_{13}$ represents an alkylene group having 1 to 6 carbon atoms.

4. A photosensitive composition as claimed in claim 1, wherein the N-3-oxo-hydrocarbon-substituted acrylamide (i) is selected from the group consisting of N-3-oxopropyl acrylamide, N-3-oxobutyl acrylamide, N-3-oxo-1-methyl-butyl acrylamide, N-3-oxo-1-methyl-1,1-diethyl-propyl acrylamide, N-3-oxo-1,1-dimethyl-butyl acrylamide, N-3-oxo-methyl-1,3-dicyclohexyl-propyl acrylamide, N-3-oxo-1,5-dimethyl-1-isopropyl-hexyl acrylamide, N-3-oxo-1,1-diisobutyl-2-isopropyl-5-methyl-hexyl acrylamide, N-3-oxo-1,1-dibutyl-2-n-propyl-heptyl acrylamide, N-3-oxo-1-methyl-butyl alphamethyl acrylamide and N-3-oxo-1,1-dimethyl-butyl alphamethyl acrylamide.

5. A photosensitive composition as claimed in claim 4, wherein the Compound (ii) is selected from the group consisting of ethyleneglycol diacrylate or -methacrylate, diethyleneglycol di-acrylate or -methacrylate, triethyleneglycol di-acrylate or -methacrylate, tetraethyleneglycol di-acrylate or -methacrylate, polyethyleneglycol (average molecular weight: 200 to 1,000) di-acrylate or -methacrylate, propyleneglycol di-acrylate or -methacrylate, dipropyleneglycol di-acrylate or -methacrylate, polypropyleneglycol (average molecular weight: 100 to 1,000) di-acrylate or -methacrylate, butyleneglycol di-acrylate or -methacrylate, trimethylolethane tri-acrylate or -methacrylate, trimethylolpropane tri-acrylate or -methacrylate and pentaerythritol tetra-acrylate or -methacrylate.

6. A photosensitive composition as claimed in claim 1, wherein the unsaturated polyester includes a plurality of amide linkages produced by chain extension of a shorter chain polyester with a diisocyanate.

7. In the process for producing a relief printing plate by exposing to a light source, through an image-bearing transparency, a photosensitive composition comprising (A) about 100 parts by weight of an unsaturated polyester produced from an alcoholic component comprising at least one polyol and an acidic component comprising at least one unsaturated dicarboxylic acid, its anhydride or its methyl or ethyl ester and having an average molecular weight of about 400 to 30,000 and an ethylenic double bond equivalent of about 160 to 3,200, and (C) about 0.0001 to 10 parts by weight of a photopolymerization initiator, thereby to effect a polymerization of said composition where said transparency was penetrated by light, and removing unpolymerized material from the areas which were unpenetrated by light, thereby to leave a relief printing plate with raised portions corresponding to the light-penetrated areas, the improvement which comprises incorporating in said composition (B) about 1 to 50 parts by weight of a Compound (i) of the formula

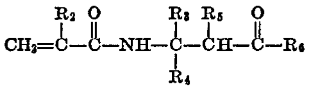

wherein $R_2$ represents a hydrogen atom or methyl group; and
$R_3$, $R_4$, $R_5$ and $R_6$ represent a hydrogen atom an alkyl group or cycloalkyl group having at most 10 carbon atoms, and about 10 to 100 parts by weight of a Compound (ii) of the formula $$\left(CH_2{=}\overset{R_1}{\overset{|}{C}}{-}COO\right)_m X$$

wherein $R_1$ represents a hydrogen atom or methyl group,
$m$ is an integer from 2 to 4, and
X represents a radical of a polyol having a molecular weight of at most 1,000 and $m$ terminal hydroxy groups from which the terminal hydroxy groups are excluded.

References Cited

UNITED STATES PATENTS

| | | | |
|---|---|---|---|
| 3,695,877 | 10/1972 | Taneda et al. | 96—35.1 |
| 3,556,791 | 1/1971 | Suzuki | 96—35.1 |
| 3,677,920 | 7/1972 | Kai et al. | 204—159.15 |
| 3,616,370 | 10/1971 | Jennings | 204—159.15 |

RONALD H. SMITH, Primary Examiner

U.S. Cl. X.R.

96—33, 115 P; 101—395; 204—159.15